(12) United States Patent
Piesinger

(10) Patent No.: US 10,551,426 B1
(45) Date of Patent: Feb. 4, 2020

(54) LIVE URD CABLE ELBOW CONNECTIVITY IDENTIFICATION METHOD AND APPARATUS

(71) Applicant: Gregory Hubert Piesinger, Cave Creek, AZ (US)

(72) Inventor: Gregory Hubert Piesinger, Cave Creek, AZ (US)

( * ) Notice: Subject to any disclaimer, the term of this patent is extended or adjusted under 35 U.S.C. 154(b) by 0 days.

(21) Appl. No.: 16/109,922

(22) Filed: Aug. 23, 2018

(51) Int. Cl.
  *G01R 31/04* (2006.01)
  *G01R 31/08* (2006.01)

(52) U.S. Cl.
  CPC ......... *G01R 31/041* (2013.01); *G01R 31/083* (2013.01)

(58) Field of Classification Search
  CPC .............................. G01R 31/083; G01R 31/041
  USPC ......................................................... 324/538
  See application file for complete search history.

(56) References Cited

U.S. PATENT DOCUMENTS

| | | | | |
|---|---|---|---|---|
| 3,513,425 A * | 5/1970 | Arndt | ..................... | H01R 13/53 337/201 |
| 3,559,141 A * | 1/1971 | Hardy | ..................... | H01H 85/20 337/224 |
| 5,333,376 A * | 8/1994 | Lawruk | ................ | G01R 31/041 29/33 F |
| 5,428,549 A * | 6/1995 | Chen | .................... | G01R 31/088 361/80 |
| 5,446,387 A * | 8/1995 | Eriksson | .............. | G01R 31/085 324/522 |
| 5,448,574 A * | 9/1995 | Yamaguchi | .......... | G01R 31/041 324/66 |
| 5,552,699 A * | 9/1996 | Redmer | ............... | G01R 31/023 324/539 |
| 5,600,248 A * | 2/1997 | Westrom | .............. | G01R 31/088 324/522 |
| 5,701,079 A * | 12/1997 | Yagi | ...................... | G01R 31/045 324/538 |
| 6,116,935 A * | 9/2000 | Fukuda | .................. | H01R 43/26 324/538 |
| 6,445,190 B1 * | 9/2002 | Sato | ..................... | G01R 31/045 324/538 |
| 6,667,610 B2 | 12/2003 | Piesinger | | |
| 6,879,917 B2 * | 4/2005 | Turner | ................. | G01R 31/085 324/522 |
| 7,031,859 B2 | 4/2006 | Piesinger | | |
| 8,570,024 B1 | 10/2013 | Piesinger | | |
| 10,451,658 B2 * | 10/2019 | Huo | ..................... | G01R 19/165 |
| 2007/0141882 A1 * | 6/2007 | Stepniak | ................ | H01R 13/53 439/187 |
| 2011/0152962 A1 * | 6/2011 | Behm | .................. | A61N 1/3625 607/10 |

(Continued)

*Primary Examiner* — Christopher P McAndrew

(57) ABSTRACT

Methods and apparatus are described to quickly and easily identify live URD elbow connectivity between junction cabinets in underground electric utility power distribution circuits so URD connected elbows can be correctly tagged. A first method segregates elbows in a cabinet into input elbows from an upstream cabinet, output elbows to a downstream cabinet, and by phase attribute. A second method injects a tracer signal into the elbow capacitive test point of an upstream output elbow and detects the tracer signal at the elbow capacitive test point of a downstream elbow capacitive test point to identify connectivity. A third method compares the output current of an upstream output elbow to that of the input current of a downstream input elbow to identify connectivity.

16 Claims, 10 Drawing Sheets

(56) References Cited

U.S. PATENT DOCUMENTS

| | | | |
|---|---|---|---|
| 2012/0181082 A1* | 7/2012 | Faulkner | H02G 1/08 |
| | | | 174/75 R |
| 2014/0103951 A1* | 4/2014 | Knierim | G01R 1/06766 |
| | | | 324/755.01 |
| 2017/0070005 A1* | 3/2017 | Joo | H01R 9/05 |
| 2017/0102415 A1* | 4/2017 | Sarchi | G01R 15/246 |

* cited by examiner

LIVE URD CABLE ELBOW CONNECTIVITY IDENTIFICATION METHOD AND APPARATUS

RELATED INVENTION

The present invention claims priority under 35 U.S.C. § 119(e) to: "Live URD Cable Elbow Connectivity Identification "Method and Apparatus" Provisional U.S. Patent Application Ser. No. 62/550,505, filed 25 Aug. 2017 which is incorporated by reference herein.

TECHNICAL FIELD OF THE INVENTION

The present invention relates to the field of electric power distribution networks. More specifically, the present invention relates to determining the connectivity of Underground Residential Distribution (URD) power cables.

BACKGROUND OF THE INVENTION

Electric power distribution networks are used by the electric utilities to deliver electricity from generating plants to customers. Although the actual distribution voltages will vary from utility to utility, in a typical network, 3-phase power at high voltage (345,000 volts phase-to-phase) is delivered to multiple transmission substations at which transformers step this high voltage down to a lower 3-phase voltage (69,000 volts phase-to-phase). This 69,000-volt 3-phase power then feeds multiple distribution substations whose transformers further step down the voltage to the distribution voltage (12,470 volts phase-to-phase) and separate the power into 3 single-phase feeder cables. Typically, these 3 feeder cables operate at 7,200 volts phase-to-ground and are designated as phase attributes A, B, and C. Each of these 3 feeder cables branch into multiple circuits to power a plurality of local pole-mounted or pad-mounted transformers which step the voltage down to a final voltage of 120/240 volts for delivery to commercial and residential customers.

In many cases, the final 7,200-volt distribution network utilizes underground (i.e., buried) cables. These cables are typically known as Underground Residential Distribution (URD) cables. Typical URD cables are shown in FIG. 1.

In a typical URD cable 20, a center conductor 22 is surrounded by an inner semiconductor sheath 24. Inner semiconductor sheath 24 serves to relieve electrical stress by spreading out and making the electrical field more uniform.

Inner semiconductor sheath 24 is surrounded by an insulator 26. Insulator 26 has significant high-voltage insulating properties to minimize the overall size of URD cable 20. Typically, insulator 26 is formed of a polymeric material, such as polyethylene.

Surrounding insulator 26 is an outer semiconductor sheath 28. Like inner sheath 24, outer sheath 28 serves to relieve electrical stress by making the electrical field more uniform. Making the electrical field more uniform protects insulator 26, which would otherwise be more likely to break down.

Outer semiconductor sheath 28 is surrounded by a shield formed of a plurality of neutral conductors 30. Neutral conductors 30 together serve as a return line (ground wire) for center conductor 22. Neutral conductors 30 are surrounded by and embedded within an insulating jacket 32. However, many older URD cables are not insulated using insulating jacket 32.

URD cables 20 are terminated using load break elbows 100 illustrated in FIG. 2. Elbow 100 is composed of insulated material 105 with pulling eye 110. A short length of insulating jacket 32 of URD cable 20 is removed, neutral conductors 30 are folded back and twisted together to form grounding wire 125 which is connected to earth ground. A compression connector 115 is attached to bare center conductor 22, and inserted into insulated material 105. Male contact pin 120 is screwed into compression connection 115.

Most modern elbows also incorporate a capacitive test point 130 covered by removable cap 135. When cap 135 is removed, test point 130 capacitive couples to center conductor 22 which allows sensing the voltage of center conductor 22.

A mating insulated elbow bushing (not shown) is mounted inside a cabinet. Using an insulated hot stick, a lineman grips the pulling eye 110 to insert or remove elbow 100 from the cabinet elbow bushing, thus making or breaking the URD cable circuit.

A simplified small portion of a typical URD circuit is illustrated in FIG. 3. Upstream single-phase attribute feeders A, B, and C branch out using junction cabinet J1. That is, phase A URD cable elbow E1 is pressed onto bushing B1 which is permanently mounted in cabinet J1. Bushings B2 and B3 are both also permanently mounted in cabinet J1 and are connected to B1. Thus, cabinet J1 expands single phase A URD cable into 2 phase A URD cables. Likewise, phase B and C URD cables are also expanded.

Also illustrated in FIG. 3 is downstream padmount transformer cabinet T1 which contains permanently mounted bushings B4 and B5 which are connected together and to the primary (high voltage) input of a step-down transformer. The secondary (low voltage) output supplies the final 120/240 volt power to the residential customer. A length of URD cable carries power from upstream junction cabinet J1 to downstream padmount cabinet T1 using elbow E3 connected to bushing B3 in junction cabinet J1 and elbow E4 connected to bushing B4 in padmount cabinet T1. Another length of URD cable typically carries power to a second downstream padmount cabinet (the next one in a long chain of downstream padmount cabinets) using elbow E5 connected to B5 in padmount cabinet T1.

Utilities assign and tag each length of URD cable with a unique number near the elbow to identify which elbows are connected to each section of URD cable. This is required so that a lineman can disconnect the correct elbow if a portion of the URD circuit must be de-energized. For example, assume the chain of downstream padmount cabinets after T1 need to be disconnected by pulling elbow E5 off of bushing B5. If the padmount tags were missing or incorrectly identified, the lineman might pull elbow E4 which would disconnect all customers connected to T1.

Unfortunately over time, equipment failures and new construction can lead to tagging errors. Utilities would like to re-confirm URD tagging accuracy, but there is currently no way to accomplish this short of pulling elbows to determine which elbows belong to a length of URD cable. Since the URD cables are buried, they cannot be visually seen where they originate. Although cable locator equipment can trace URD cables from one cabinet to another, this equipment cannot identify which elbow connects to the cable being tracked since both the input and output elbows are connected together via the two cabinet bushings. For example in cabinet T1, bushings B4 and B5 connect elbows E4 and E5 together.

Junction cabinets are implemented each time a URD cable branch is required. Long chains of padmount transformer cabinets snake through residential neighborhoods, each serving one or a few houses. Therefore, URD cable circuits are extensive. Junction cabinets sometimes contain multiple single phase feeders and some of the feeders could split into multiple branches going to additional junction cabinets and to multiple different chains of padmount transformer cabinets.

Currently no method or apparatus exists to quickly and easily identify elbow connectivity on live URD cable circuits so as to accurately confirm if each elbow tag is either correct or needs to be re-tagged. Even small and medium size utilities have thousands or tens of thousands of URD elbows in active service. Conducting an utility wide elbow connectivity survey today without better tools and techniques (as disclosed in this patent application) would be prohibitively expensive and is rarely (if ever) performed

SUMMARY OF THE INVENTION

Accordingly, it is an advantage of the present invention that methods are disclosed for determining the connectivity of live URD cable circuits.

It is another advantage of the present invention that apparatus are disclosed to implement the disclosed methods in an efficient manner to quickly identify the elbows connected to each length of live URD cable.

The above and other advantages of the present invention are carried out for determining the connectivity of URD cables in an electric power network operating at a line frequency which is 60 Hertz in the United States (US) and 50 Hertz in many locations outside the US.

Three different methods and apparatus are disclosed in the current invention which, individually or together, ensure that elbow connectivity identification can be quickly and accurately performed for all URD circuits.

The first method identifies input and output elbows in a cabinet by monitoring each elbow current using an AC current sensor. If the elbow current is nearly in-phase with the elbow voltage, the elbow is an input elbow. If the current is nearly out-of-phase with the elbow voltage, the elbow is an output elbow.

The second method injects a tracer signal into an upstream elbow test point and probes downstream elbow test points for the tracer signal to indicate which downstream elbow is connected to the upstream elbow.

The third method simultaneously measures the current in one or more upstream elbows. Downstream elbow currents are measured to find which downstream elbow has nearly identical current as an upstream elbow. Elbows with nearly identical currents are identified as being connected.

Depending on the particular URD circuit, one of these three methods will be quicker and more effective than the other two methods. For example, long daisy chains of neighborhood padmounts on a single phase circuit each contain a single input elbow and a single output elbow. For this circuit, the first method for identifying the input and output elbow in each padmount is the quickest and easiest. The lineman simply moves down the chain to each padmount and tags its input elbow as connected to the previous upstream output elbow.

Other objects and advantages of the present invention will become obvious as the preferred embodiments are described and discussed below.

DETAILED DESCRIPTION OF THE PREFERRED EMBODIMENTS

Figure 4:
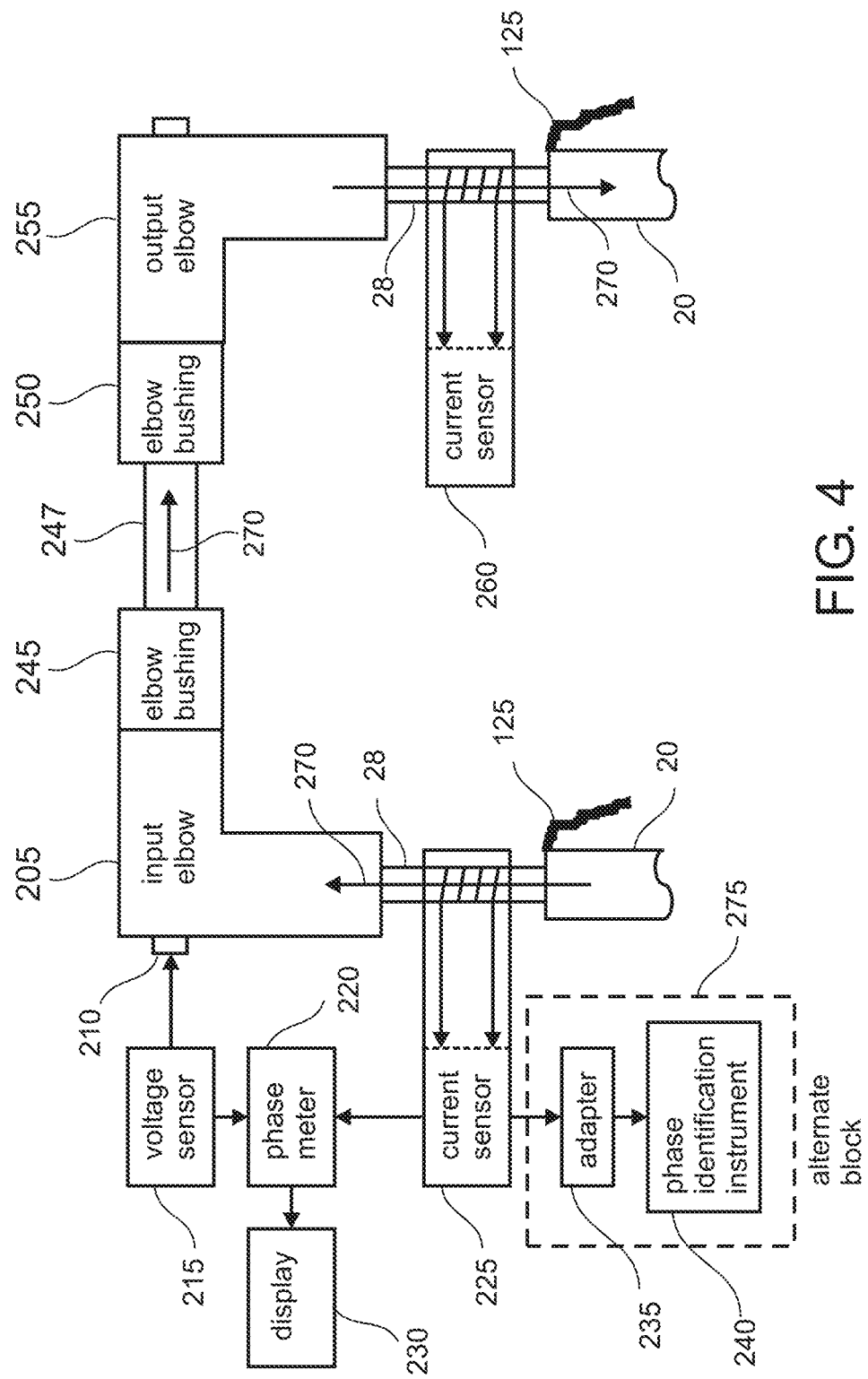
FIG. 4 illustrates a block diagram of the first method for identifying input and output elbows in a junction cabinet.

The first method for identifying input and output elbows in a cabinet, by monitoring elbow currents is illustrated in FIG. 4. Input elbow 205 is connected to output elbow 255 through bushings 245 and 250 respectively, which are connected together using bus bar 247. URD current 270 flows into input elbow 205, through elbow bushings 245 and 250, and out elbow bushing 255. Current sensor 225 senses current 270 flowing into input elbow 205. Voltage sensor 215 senses AC voltage at test point 210 on input elbow 205. Phase meter 220 compares current sensor 225 phase with voltage sensor 215 phase and indicates the differential phase on display 230. Likewise, identical current sensor 260 senses current 270 flowing out of output elbow 255 (connection to phase meter not illustrated). Current sensors 225 and 260 are illustrated as using a current sensing coil of wire which is the method used by virtually all current sensors.

Assuming phase meter 220 is initially setup so as to display current sensor 225 phase as nearly in-phase with voltage sensor 215 phase, then current sensor 260 phase will be displayed as nearly out-of-phase with voltage sensor 215 phase. This occurs because current 270 is flowing in the opposite direction through current sensor 260 compared with the current direction through current sensor 225. It is well known that reversing current through an AC current sensor reverses the phase of its AC output signal.

To measure URD cable 20 center conductor current, current sensors 225 and 260 must be applied directly below the elbow where jacket 32 and concentric neutrals 30 are stripped back from URD cable 20 leaving only outer semicon 28 (refer to FIG. 1). Applying the current sensor below this stripped back portion, senses the sum of current flowing in both center conductor 22 and concentric neutral 30. Concentric neutral 30 is the return path for URD center conductor 22 supply current. These two currents are essentially equal and opposite and therefore cancel as is well known by those skilled in the art.

FIG. 4 illustrates a generic block diagram of the first method for identifying input and output elbows by monitoring elbow current phases. Current sensor 260 could be connected to phase meter 220. However, applying current sensor 260 is actually not required. Instead, current sensor 225 can simply sequentially sense current phase in each elbow. If current sensor 225 phase is in-phase with voltage sensor 215 phase, the elbow is an input elbow. If not, the elbow is an output elbow. Since the center conductor of both elbows are connected, the test point voltages on both elbows are essentially the same amplitude and phase. Therefore, only voltage phase need be sensed at one test point.

The best implementation of this first method for identifying input and output elbows is illustrated in FIG. 4 using current sensor 225 and alternate block 275 which consists of voltage input phase identification instrument 240 and current to voltage adapter 235. Voltage input phase identification instrument 240 is described in commonly owned U.S. Pat. No. 8,570,024 issued Oct. 29, 2013. An example of a commercial instrument is the Origo Corporation G3 PhaseID System.

Figure 5:
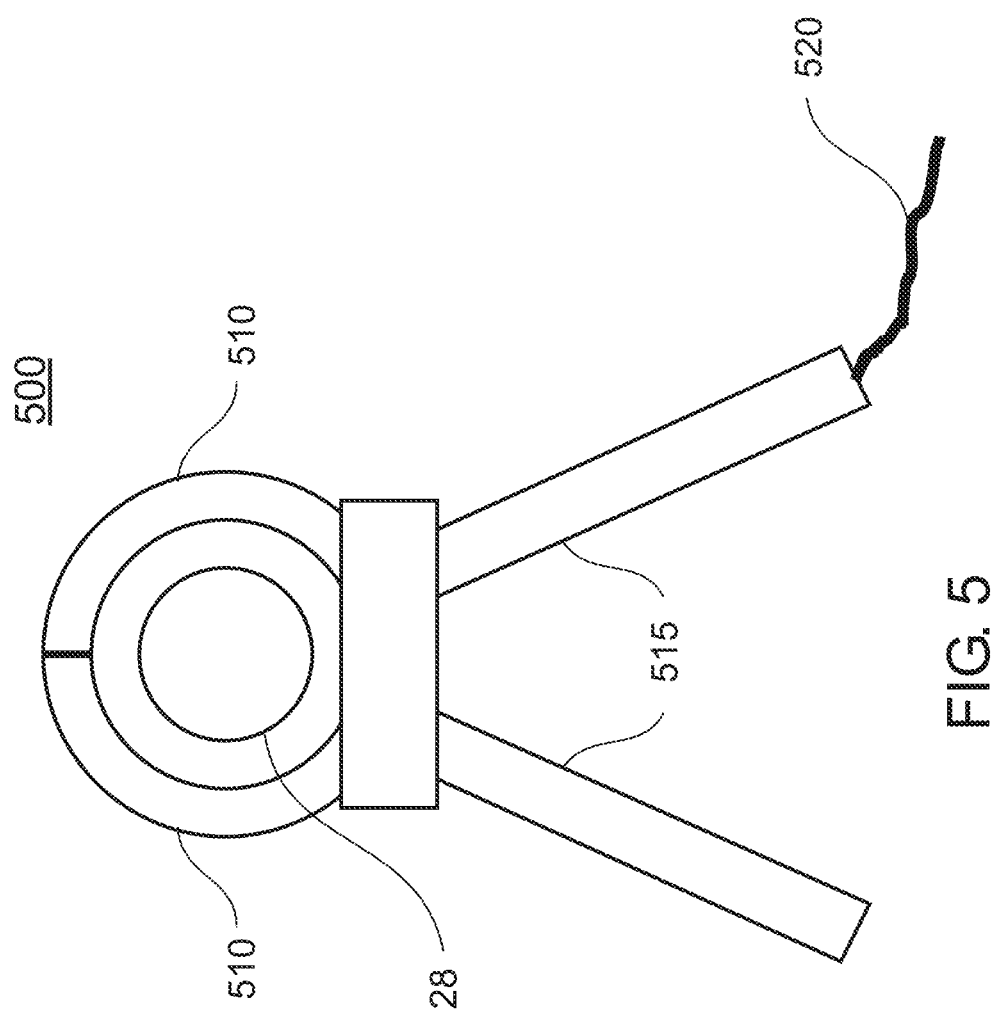
FIG. 5 illustrates a typical AC current clamp.

Phase identification instrument 240 is designed to measure voltage phase on any energized conductor. Adapter 235 allows phase identification instrument 240 to also measure current phase using a standard AC current clamp 500 illustrated in FIG. 5, such as a Fluke i400, as current sensor 225.

In operation, a lineman squeezes handles 515 together which opens spring loaded jaws 510 so as to place AC current clamp 500 around stripped back URD cable 28. Leads 520 are plugged into adapter 235 which in turn is plugged into voltage input phase identification instrument 240.

Figure 6:
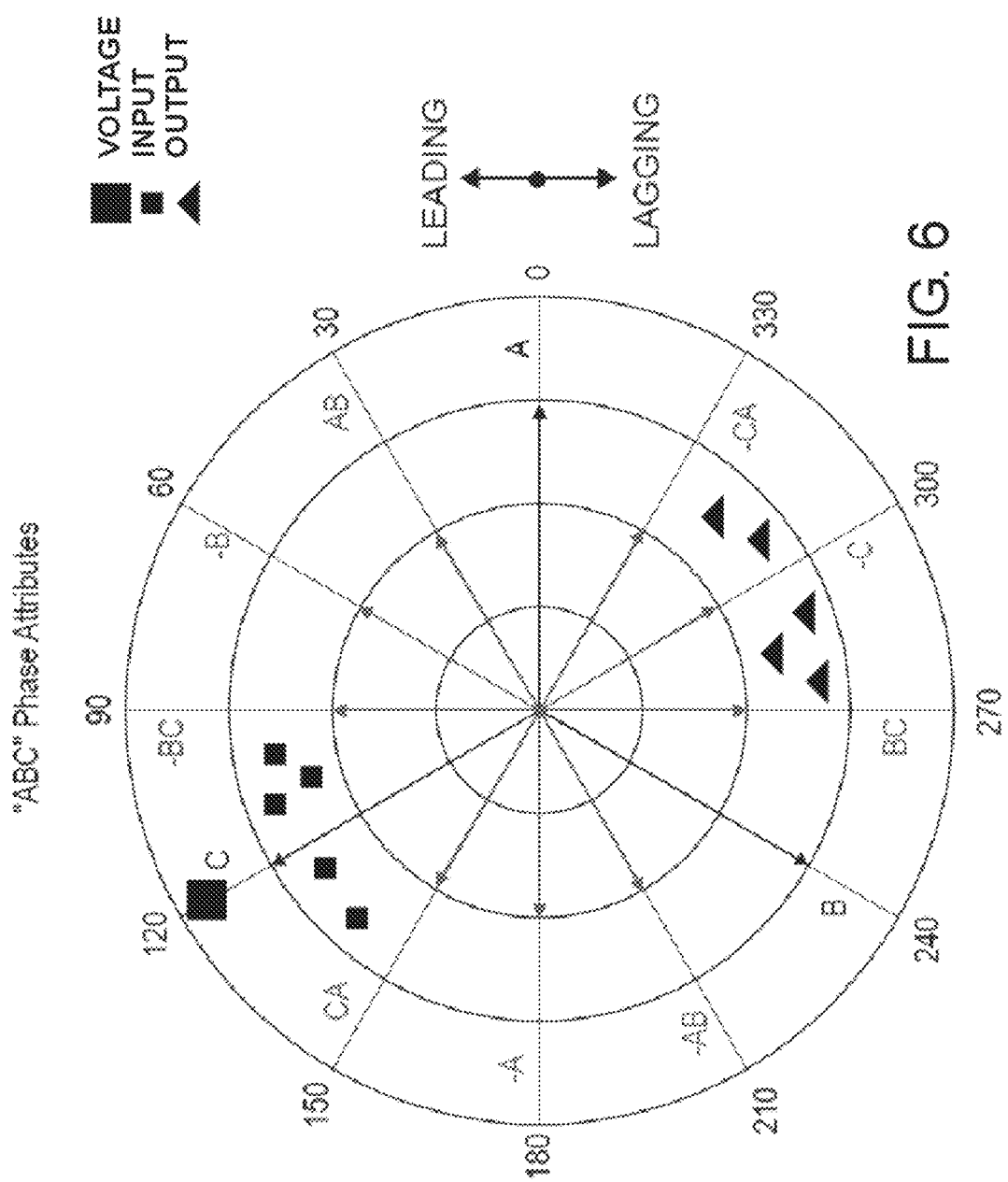
FIG. 6 illustrates input and output voltage and current phase in an example junction cabinet.

Phase identification instrument 240 reference phase is initially set to the utility reference phase. Then, AC current clamp 500 is simply applied to each elbow to determine if the elbow is an input elbow or output elbow. Typical results are illustrated in FIG. 6 for a single phase C cabinet containing multiple input and output elbows. Voltage phase for the entire cabinet is indicated by the large square. Input elbow current phases are indicated by small squares and output elbow current phases by triangles. Note that input elbow current phases are nearly in-phase with voltage phase and output elbow current phases are nearly out-of-phase with voltage phase. Current phases will vary slightly due to differing power factors associated with different elbow currents.

This first method for determining elbow connectivity identification using phase identification instrument 240 is the optimum and fastest method to use on long daisy chains of padmount transformers as they snake through neighborhoods since each padmount contains a single input elbow and a single output elbow. If one elbow is identified as an input elbow, the other elbow must be an output elbow and vice versa. A single lineman can simply walk to the next padmount, open it, measure current phase on one elbow, tag both elbows, close the padmount, and walk to the next one in the chain.

This first method is also optimum for first segregating all elbows in large cabinets into input elbows and output elbows associated with each voltage phase attribute A, B, and C, prior to identifying their upstream sources and downstream destinations.

Figure 7:
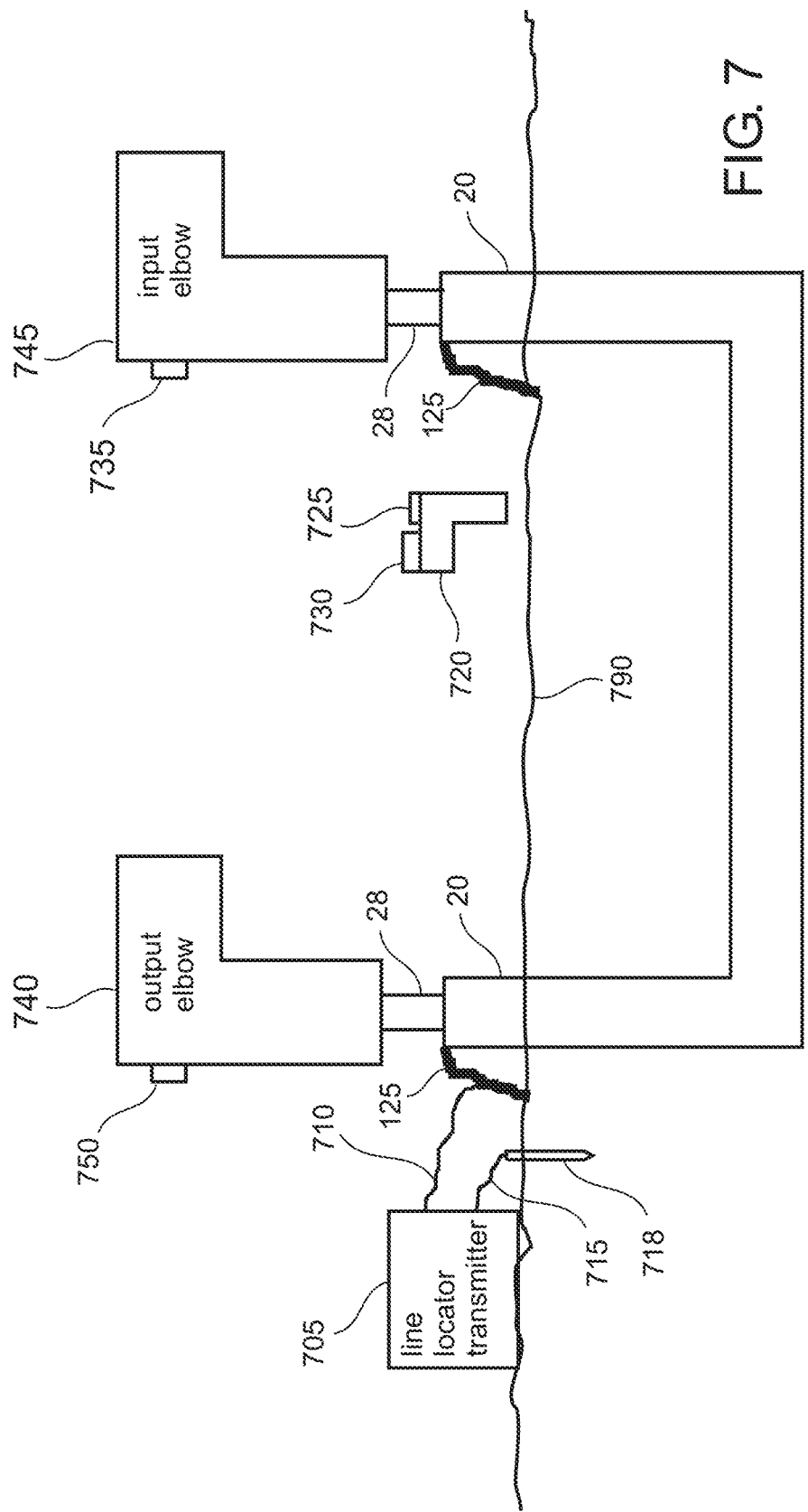
FIG. 7 illustrates using a standard line locator to trace buried URD cable between junction cabinets.
Figure 8:
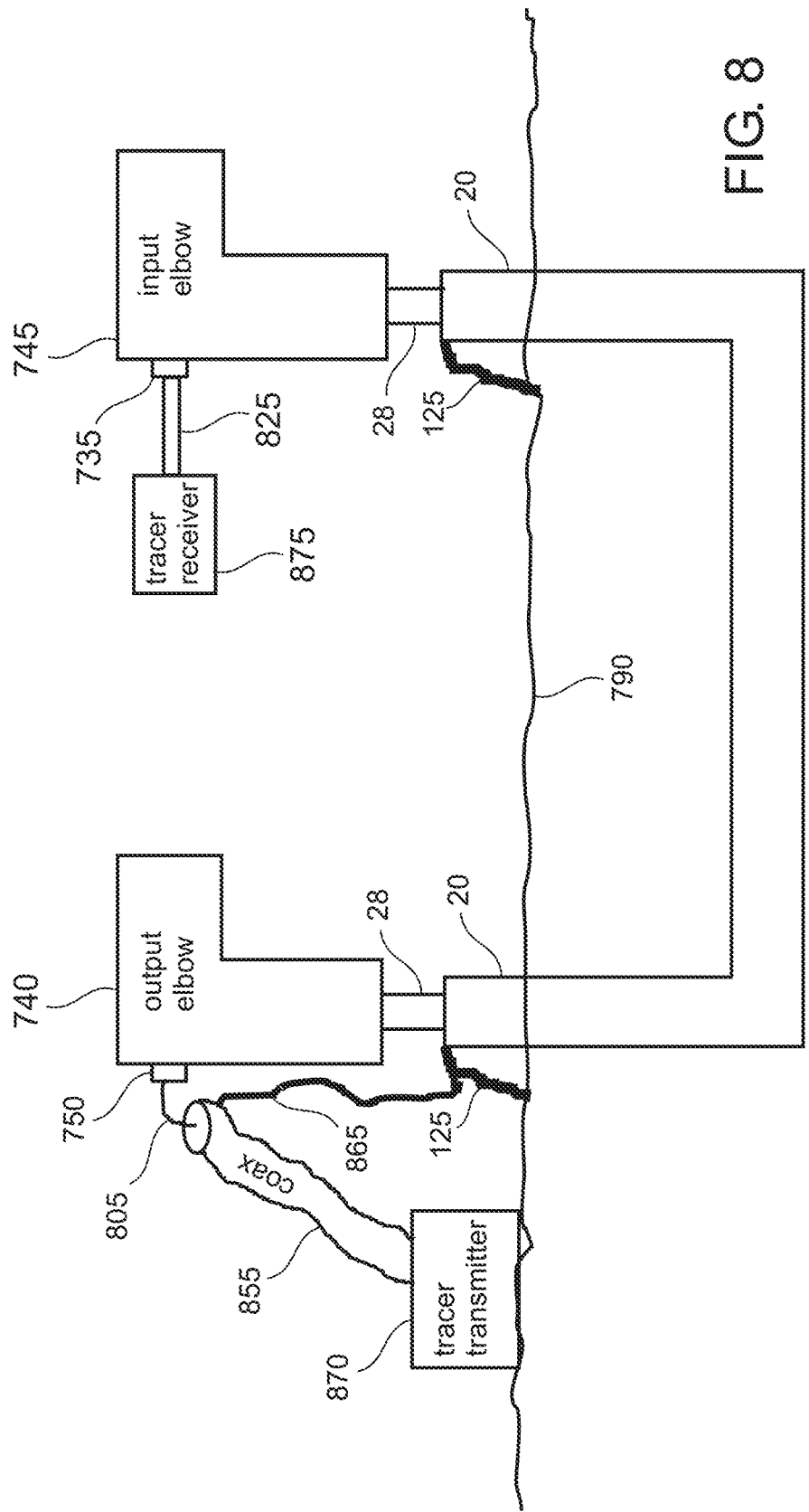
FIG. 8 illustrates the second method of identifying input and output elbows in a junction cabinet by injecting a tracer signal into an elbow test point in one junction cabinet and detecting it at another elbow test point in a second junction cabinet.

The second method for identifying elbow connectivity injects a tracer signal into an upstream output elbow test point and searches for that tracer signal on a downstream input elbow test point. The method is illustrated in FIG. 7 and FIG. 8.

Currently, the standard method for determining which downstream cabinets are connected to an upstream cabinet is to use a line locator. Line locators (also called pipe locators or cable tracers) are offered by numerous manufacturers and basically all operate on the same principal. The Utiligard by Subsite Electronics is a typical example. They are composed of a line locator transmitter 705 and a line locator receiver 720.

Figure 2:
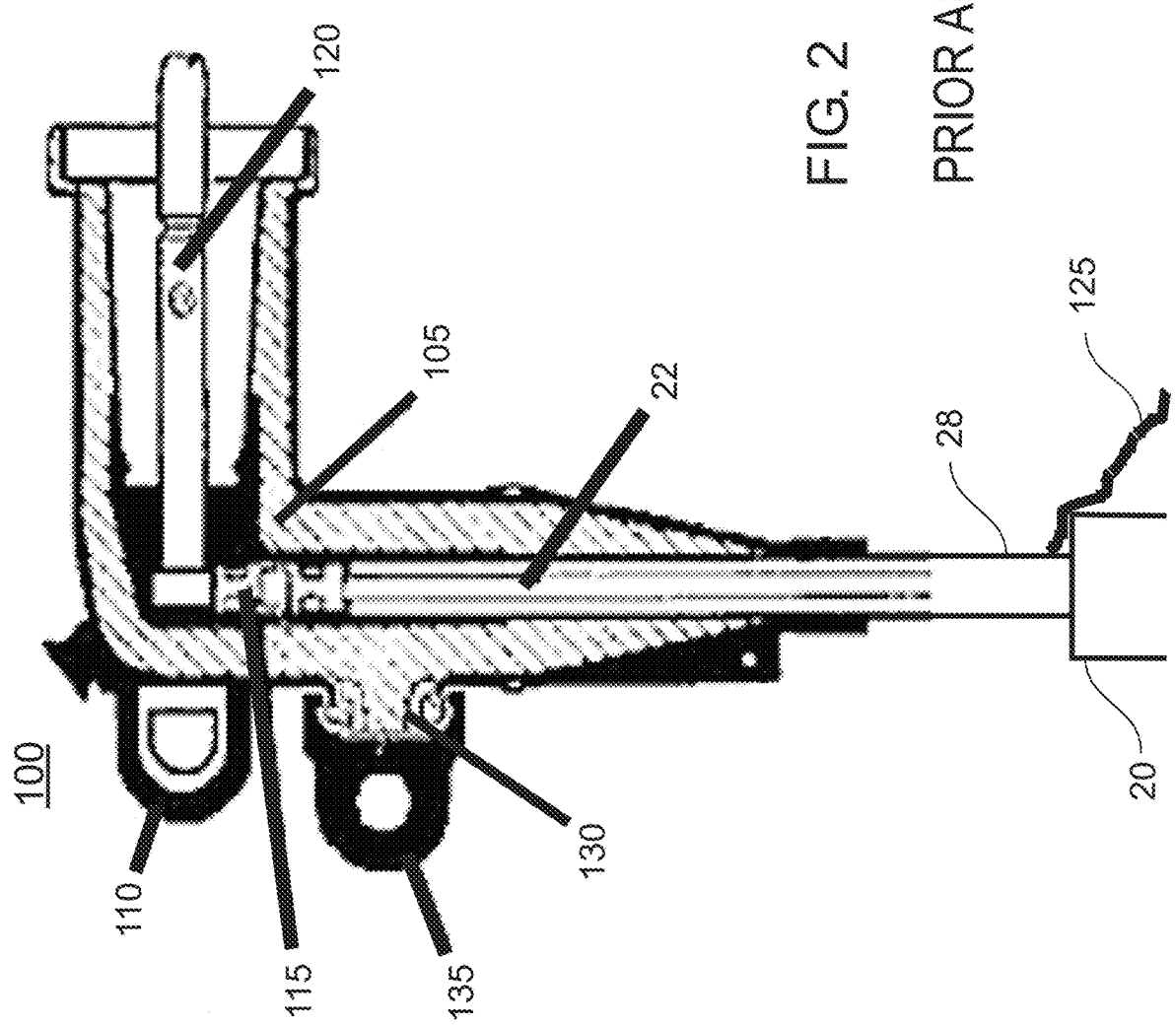
FIG. 2 illustrates typical URD elbows.
Figure 3:
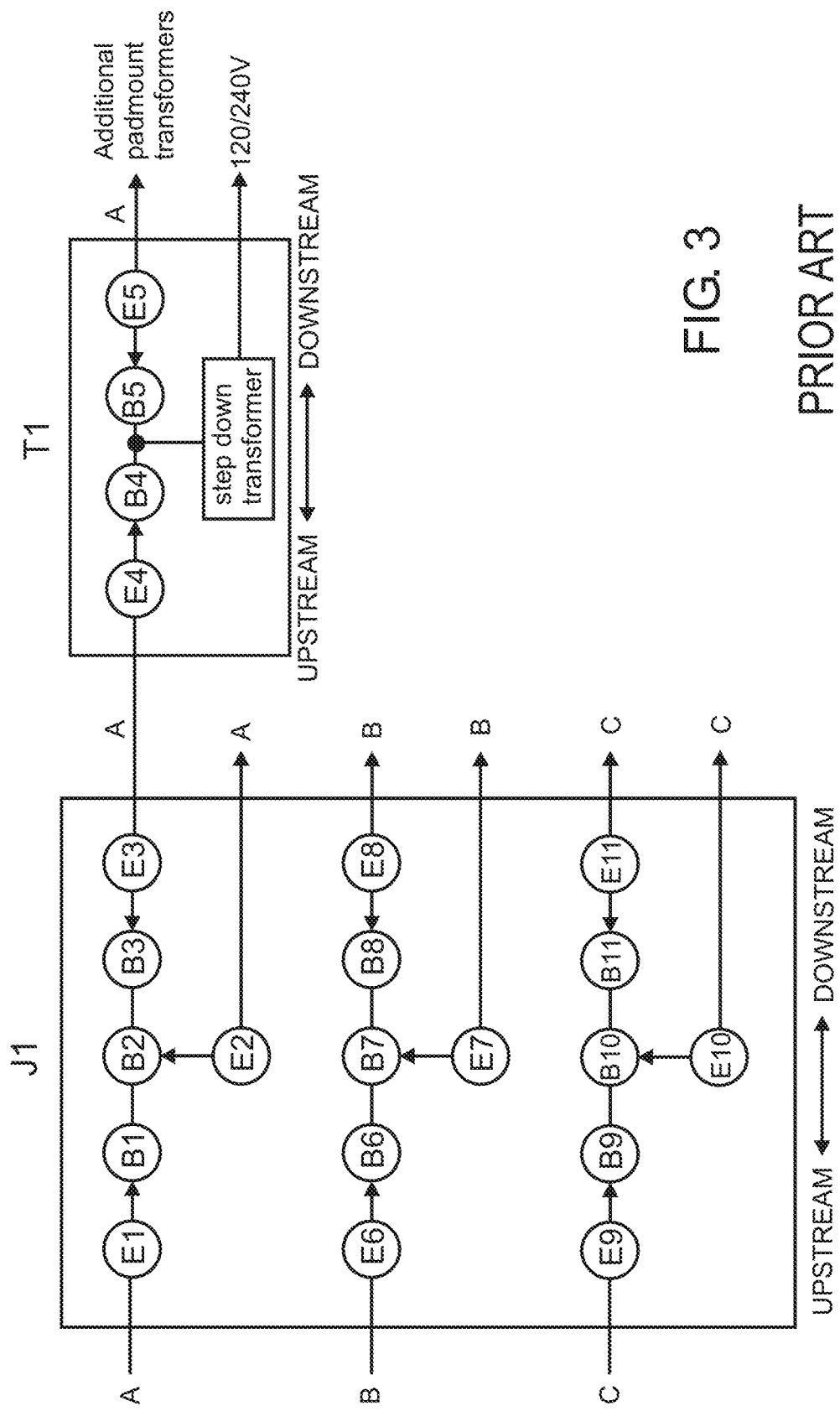
FIG. 3 illustrates a simplified example of a small portion of a typical URD circuit.

Line locator transmitter 705 generates a signal typically around 100 KHz to 200 KHz on signal lead 710 which is connected to URD cable 20 grounding wire 125 (twisted concentric neutral conductors 30 as was illustrated in FIG. 2), and its ground wire 715 is connected to a ground rod 718 driven into the earth a few feet away from grounding wire 125 ground point. This creates a magnetic field along any metal path. Line locator receiver 720 contains display 725 and is carried by handle 730. It detects the magnetic field produced by line locator transmitter 705 along any metal path.

Although a line locator will track the URD concentric neutral between output elbow 740 in an upstream cabinet and input elbow 745 in a downstream cabinet, it also tracks the concentric neutrals of any other URD cables in the upstream cabinet. Since the concentric neutrals of all URD cables in a cabinet are connected together, a line locator will trace the paths of every URD cable in the cabinet. Even if upstream output elbow 740 is traced to the correct downstream cabinet, it doesn't indicate the specific input elbow 745 in that cabinet to which output elbow 740 is connected.

FIG. 8 illustrates how the second method for identifying elbow connectivity solves this problem by using tracer transmitter 870 to inject a high frequency tracer signal into test point 750 of upstream output elbow 740. Center conductor 805 of coax 855 is connected directly to test point 750 and its shield is connected via a short ground wire 865 to URD 20 grounding wire 125 at a point as close as possible to output elbow 740.

Maximum tracer signal is injected into test point 750 by keeping center conductor 805 lead length short, ground wire 865 short, and selecting coax 855 characteristic impedance to match the URD cable 20 characteristic impedance. More importantly, this coax to URD connection technique minimizes the stray tracer signal injected onto any adjacent URD cables. As is well known by those skilled in the art, maximum injection of high frequency signals occurs when the connection impedance mismatch is low and minimum injection occurs when connection impedance mismatch is high.

The result is that maximum signal will propagate through upstream output elbow 740 URD cable 20 and into downstream input elbow 745 test point 735. Only minuscule tracer signal will couple onto other URD cables in either the upstream or downstream cabinets. At the downstream cabinet, tracer receiver 875 uses electric field probe 825 to detect the tracer signal on test point 735 of downstream elbow 745. Although it might be possible to detect the tracer signal on some other test points in the downstream cabinet, their amplitudes will be much lower than the amplitude on test point 735 of connected downstream elbow 745.

Figure 9:
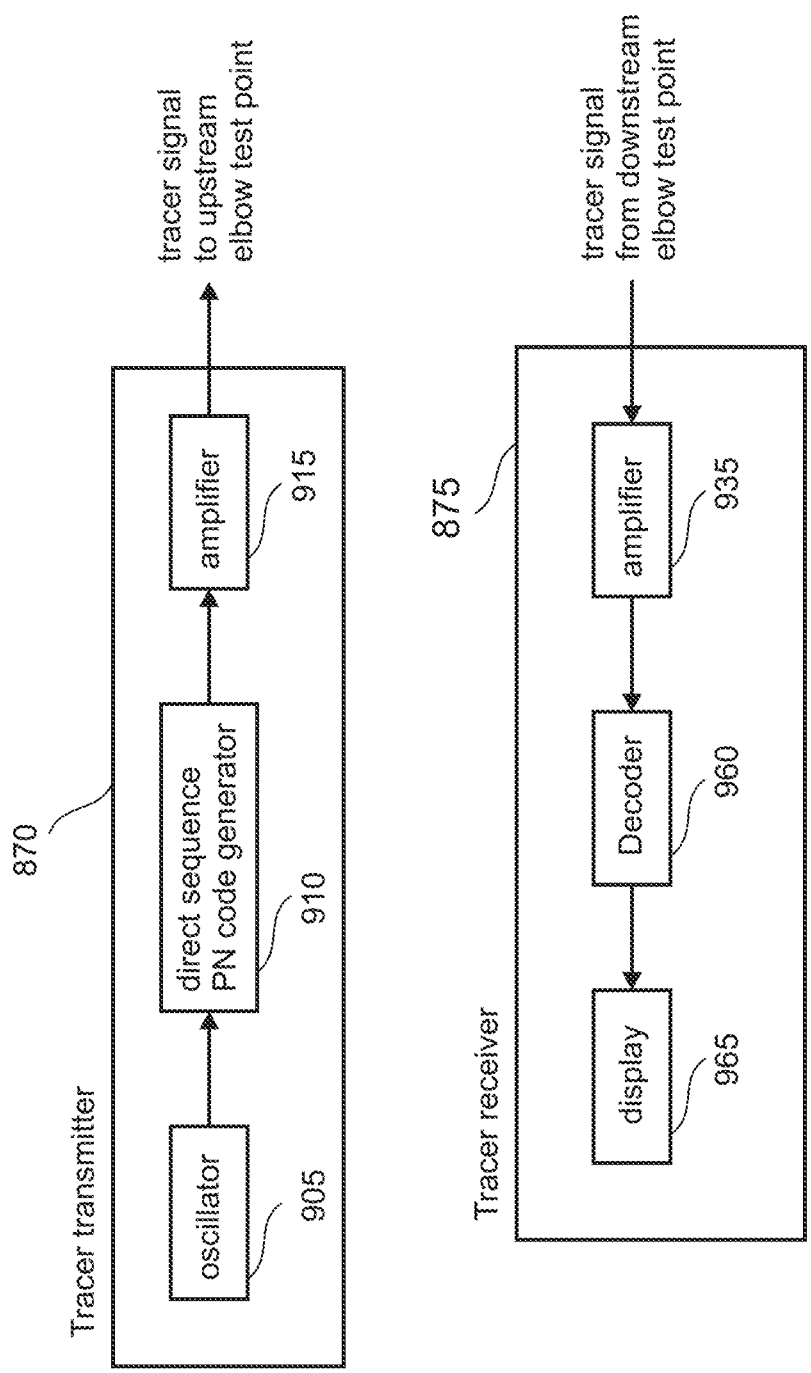
FIG. 9 illustrates a block diagram of a tracer transmitter and receiver.

There are numerous techniques available to implement tracer transmitter 870 and tracer receiver 875. Almost any method of generating and receiving a signal can be used. The most optimum technique is illustrated in FIG. 9 in which a direct sequence spread spectrum tracer signal is used. This is a very common communication signal used by the global Positioning System (GPS), Code Division Multiple Access (CDMA) mobile phone systems, and many other communication systems.

Tracer transmitter 870 in FIG. 9 creates a spread spectrum signal using direct sequence pseudo random (PN) code generator 910 clocked by oscillator 905, amplified by amplifier 915, and applied to elbow test point 750 as was illustrated in FIG. 8.

Tracer receiver 875 capacitive couples to test point 735. Spread spectrum tracer signal on test point 735 is amplified using amplifier 935, decoded in decoder 960, and displayed on display 965. Tracer receiver 875 is a small handheld portable unit that can be sequentially touched to each cabinet elbow test point to detect the URD cable energized by tracer transmitter 870.

Tracer transmitter 870 and tracer receiver 875 illustrated in FIG. 9 are very generic. Numerous analog and digital techniques can be used to implement this type of communication system as is well known by those skilled in the art. The only requirement is that the frequency, sensitivity, and power of the signal be adequate to be detected at the downstream cabinet elbow test point.

Although this second method was described as connecting the tracer transmitter to the upstream elbow and detecting the tracer signal on the downstream elbow, the method will work just as well when the tracer transmitter is connected to the downstream elbow and the tracer signal detected on the upstream elbow.

A more efficient method of using this second method is to use the first method to segregate all elbows of both upstream and downstream cabinets into input elbows and output elbows associated with each voltage phase attribute A, B, and C as was described before. Assume the upstream cabinet contains a single phase B output elbow and the downstream cabinet contains multiple phase B input elbows. Then the tracer signal need only be applied to the phase B upstream output elbow and searched for on the phase B downstream input elbows to determine which phase B downstream input elbow is connected to the phase B upstream elbow.

Similarly, if the downstream cabinet contains a single phase B input elbow and the upstream cabinet contains multiple phase B output elbows, then the tracer signal need only be applied to the downstream phase B input elbow and searched for on upstream phase B output elbows to determine which upstream phase B output elbow is connected to the downstream phase B input elbow. If both upstream and downstream cabinets contain multiple input or output elbows of the same phase attribute, then the tracer signal can be sequentially applied to the elbows to be traced.

The third method for identifying input and output elbows simultaneously measures current in upstream and downstream elbow URD cables. Elbow URD cables with essentially identical currents are identified as being connected.

In general, a lineman with a current clamp meter (current clamp with built-in current display) can be stationed at two cabinets known to be connected by one or more URD cables. The upstream lineman attaches his meter to a first elbow and communicates its current reading to the downstream lineman each second or so. The downstream lineman uses his current clamp meter to sequentially measure each elbow current looking for a match. When a match is found, the upstream and downstream elbows are tagged as connected.

Although this technique works, it is terribly slow and inefficient if multiple elbows are present in one or both cabinets. It is even more inefficient if multiple downstream cabinets must be checked to find a connected URD cable. URD currents are statistical and vary continuously as customers switch on and off various appliances or when heating and cooling equipment cycles. Therefore, upstream and downstream current measurements must be nearly simultaneous.

Figure 10:
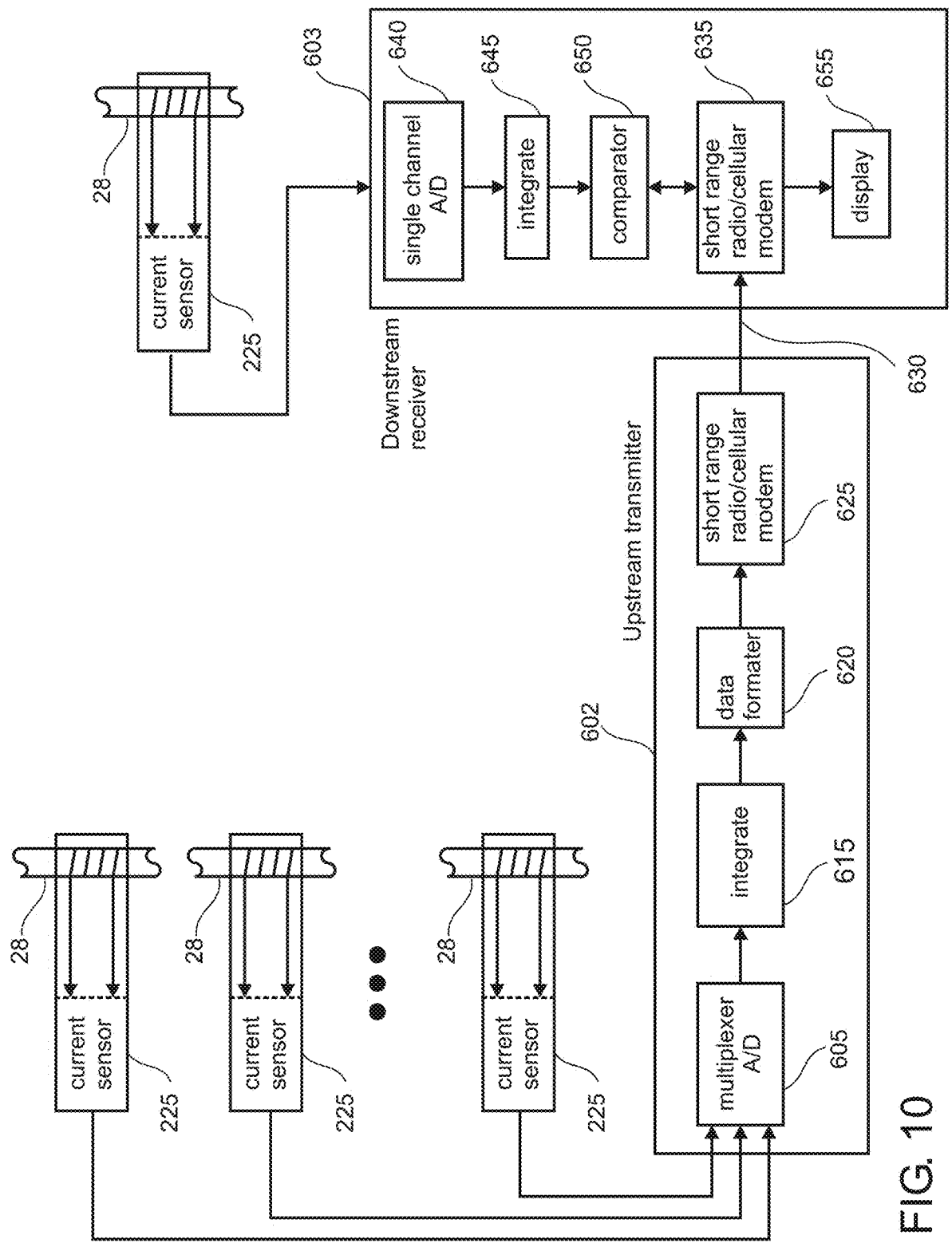
FIG. 10 illustrates a block diagram of the third method of identifying input and output elbows in a junction cabinet by measuring and comparing URD currents in connected junction cabinets.

The third method for identifying input and output elbows using an efficient current matching technique is illustrated in FIG. 10 where short range radio or cellular communication is used to simultaneous compare upstream and downstream elbow currents.

Assume the upstream cabinet contains multiple output elbows. Assume the lineman attaches a current clamp 225 to each of the output elbow URD cables 28 as was illustrated in FIG. 4. Each current clamp 225 is plugged into upstream transmitter 602 which simultaneously measures all current clamp 225 currents using high speed multiplexer analog-to-digital converter (A/D) 605. These currents are each integrated over a short period of time (for example 1 second), formatted and assigned a reference number in data formatter 620, and transmitted using short range radio or cellular modem 625.

Short range radio or cellular modem 635 in downstream receiver 603 receives upstream current sensor 602 transmission 630. Downstream lineman attaches his current clamp 225 to an input elbow URD cable 28, single channel A/D 640 and integrator 645 measures input elbow URD cable 28 current, comparator 650 compares this input current against the received list of tagged upstream output current values from short range radio or cellular modem 635, and displays matching current upstream reference number on display 655.

Using this third method, downstream lineman only has to make one current measurement per input elbow to determine if it is connected to an upstream cabinet output elbow, and if connected, immediately know the reference number of the upstream output elbow.

This third method is most applicable to large junction cabinets that contain many (perhaps a dozen or more) elbows and scant knowledge of which cabinets they come from or go to. The ability to continuously know the currents of all output elbows can save hours of searching multiple downstream cabinets and elbows for a current match.

The block diagram illustrated in FIG. 10 is very generic. Any implementation that continuously communicates upstream cabinet output elbow currents to a lineman checking downstream cabinet input elbows is acceptable. Depending on range, Bluetooth, WiFi, cellular, or multi-use radio service (MURS) communications could be used. A smart phone app could even be written where the upstream lineman's phone talks to the upstream current sensor 602, the downstream lineman's phone talks to the downstream current sensor 603, and the phones connect with each other over normal cellular communication.

Figure 1:
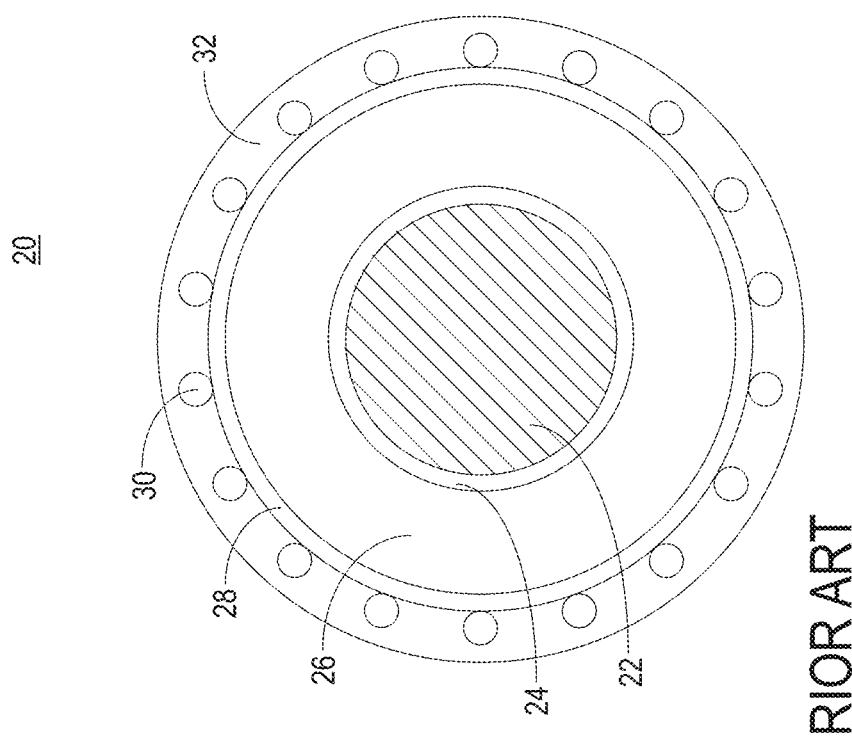
FIG. 1 illustrates typical URD cable.

Using a sensitive current sensor, it can also be attached to the complete URD cable 20 in FIG. 1 instead of only around outer sheath 28 as described in FIG. 4. The sum of center conductor 22 current and concentric neutral 30 current is very low, but seldom exactly zero due to alternate return current paths on other URD cables. Although low, it will be identical at all points along a jacketed URD cable. Therefore, this third method of identifying URD cables can also be used to identify which of multiple URD cables exposed in a trench are connected to a particular elbow. This is a very important benefit as electric utilities have been searching for a reliable method of identifying URD cables in an open trench for decades.

Placing the current sensor around the complete URD cable is also beneficial in cabinets where an insufficient length of exposed outer sheath 28 is available below the elbow to accommodate the current sensor.

Although the preferred embodiments of the invention have been illustrated and described in detail, it will be readily apparent to those skilled in the art that various modifications may be made therein without departing from the spirit of the invention.

For example, for the third method, current sensors other than the current clamp or current clamp meters described here could be used. A current transformer (CT) is a type of transformer that is used to measure AC current. They come in numerous sizes and styles. Like the current clamps and current clamp meters described here, they produce an AC current in its secondary which is proportional to the AC current in it its primary (the wire or conductor around which it is attached). Almost any primary current sensitivity required is available. Using a sensitive current sensor, it could be attached to the complete URD cable 20 in FIG. 1 instead of only around outer sheath 28 as described in FIG. 4. as was explained earlier.

In general, examples in this disclosure were described as using the upstream cabinets as the source and downstream cabinets as the destination. However, all examples can also use the downstream cabinets as source and upstream cabinets as destination.

What is claimed is:

1. A method of identifying elbow connectivity of multiple live URD power cables between junction cabinets, said method comprising:
    measuring voltage phase of each said URD cable in each said junction cabinet;
    measuring current phase of each said URD cable in each said junction cabinet;
    identifying said elbow as an input elbow when said current phase is nearly in-phase with said voltage phase;
    identifying said elbow as an output elbow when said current phase is nearly out-of-phase with said voltage phase; and
    tagging a said input elbow in a downstream junction cabinet as connected to a said output elbow in an upstream junction cabinet when said input elbow and said output elbow have the same phase attribute.

2. A method as claimed in claim 1 additionally comprising measuring input current of each said input elbow of similar phase attribute in said downstream junction cabinet;
    measuring output current of each said output elbow of similar phase attribute in said upstream junction cabinet;
    tagging a said input elbow in a said downstream junction cabinet as connected to a said output elbow in a said upstream junction cabinet when downstream said input current in said input elbow is nearly identical to upstream said output current in said output elbow; and
    tagging a said output elbow in a said upstream junction cabinet as connected to a said input elbow in a said downstream junction cabinet when upstream said output current in said output elbow is nearly identical to downstream said input current in said input elbow.

3. A method as claimed in claim 1 wherein said voltage phase is measured at elbow test point.

4. A method as claimed in claim 3 wherein said voltage phase is measured using a voltage input phase identification instrument.

5. A method as claimed in claim 1 wherein said current phase is measured on said URD cable below said elbow where jacket and concentric neutrals are stripped back from said URD cable.

6. A method as claimed in claim 5 wherein said current phase is measured using a current input phase identification instrument.

7. A method as claimed in claim 5 wherein said current phase is measured using a standard AC current clamp connected to a current to voltage adapter connected to voltage input phase identification instrument.

8. A method as claimed in claim 1 additionally comprising sequentially injecting a tracer signal into each said output elbow test point of similar phase attribute in said upstream junction cabinet;
    sequentially measuring downstream junction cabinet said tracer signal amplitude of each said input elbow test point of similar phase attribute as said upstream junction cabinet phase attribute; and
    tagging downstream junction cabinet said input elbow with highest said tracer signal amplitude as connected to said output elbow in said upstream junction cabinet.

9. A method as claimed in claim 1 additionally comprising sequentially injecting a tracer signal into each said input elbow test point of similar phase attribute in said downstream junction cabinet;
    sequentially measuring upstream junction cabinet said tracer signal amplitude of each said output elbow test point of similar phase attribute as said downstream junction cabinet phase attribute; and
    tagging upstream junction cabinet said output elbow with highest said tracer signal amplitude as connected to said input elbow in said downstream junction cabinet.

10. A method as claimed in claim 8 wherein said tracer signal is a direct sequence spread spectrum signal.

11. A method as claimed in claim 9 wherein said tracer signal is a direct sequence spread spectrum signal.

12. A method of identifying elbow connectivity of multiple live URD power cables between an upstream junction cabinet and one or more downstream junction cabinets, said method comprising:
    measuring output current of each output elbow in said upstream junction cabinet;
    measuring input current of each input elbow in said one or more downstream junction cabinets;
    comparing said output current of each output elbow in said upstream junction cabinet to said input current of each input elbow in said one or more downstream junction cabinets; and
    tagging a said output elbow in said upstream junction cabinet as connected to a said input elbow in a said one or more downstream junction cabinets when said output current in a said output elbow in said upstream junction cabinet is essentially equal to said input current in a said input elbow in said one or more downstream junction cabinets.

13. A method as claimed in claim 12 wherein said measuring output current of each output elbow and said measuring input current of each input elbow is implemented using a current transformer.

14. A method as claimed in claim 12 wherein said measuring output current of each output elbow in said upstream junction cabinet occurs simultaneously.

15. A method as claimed in claim 12 additionally comprising associating a reference number to each said output elbow in said upstream junction cabinet;
    communicating said reference number and output current of each said output elbow in said upstream junction cabinet to said one or more downstream junction cabinets; and
    using said reference number to identify which output elbow in said upstream junction cabinet is essentially equal to said input current in a said input elbow.

16. A method as claimed in claim 15 wherein said communicating is implemented using either short range radio, cellular modem, Bluetooth, WiFi, multi-use radio service, or smart phone app.

* * * * *